US006618401B2

United States Patent
Tanimoto et al.

(10) Patent No.: US 6,618,401 B2
(45) Date of Patent: Sep. 9, 2003

(54) VARIABLE WAVELENGTH LIGHT SOURCE

(75) Inventors: Takao Tanimoto, Hadano (JP); Toshiyuki Ozaki, Atsugi (JP); Masanori Takizawa, Kawasaki (JP)

(73) Assignee: Anritsu Corporation, Tokyo (JP)

(*) Notice: Subject to any disclaimer, the term of this patent is extended or adjusted under 35 U.S.C. 154(b) by 0 days.

(21) Appl. No.: 09/980,570
(22) PCT Filed: Mar. 29, 2001
(86) PCT No.: PCT/JP01/02671
§ 371 (c)(1), (2), (4) Date: Oct. 31, 2001
(87) PCT Pub. No.: WO01/76027
PCT Pub. Date: Oct. 11, 2001

(65) Prior Publication Data
US 2003/0072334 A1 Apr. 17, 2003

(30) Foreign Application Priority Data
Mar. 30, 2000 (JP) ......................................... 2000-093801

(51) Int. Cl.[7] .............................. H01S 3/10; H01S 3/13; H01S 3/00
(52) U.S. Cl. ...................... 372/20; 372/28; 372/29.011; 372/38.01; 372/38.02
(58) Field of Search .............................. 372/20, 28, 32, 372/38.01, 38.02, 29.011, 102

(56) References Cited

U.S. PATENT DOCUMENTS

| 5,442,651 A | | 8/1995 | Maeda |
| 6,081,539 A | * | 6/2000 | Mattori et al. ................. 372/20 |
| 6,282,215 B1 | * | 8/2001 | Zorabedian et al. .......... 372/20 |

FOREIGN PATENT DOCUMENTS

| JP | 6-112583 A | 4/1994 |
| JP | 9-270557 A | 10/1997 |
| JP | 11-289118 A | 10/1999 |

* cited by examiner

Primary Examiner—Paul Ip
Assistant Examiner—Armando Rodriguez
(74) Attorney, Agent, or Firm—Frishauf, Holtz, Goodman & Chick, P.C.

(57) ABSTRACT

A tunable laser source changes the resonator length of an external resonator, which is constituted including a laser diode and a diffraction grating, by a driver controlled by a drive control section, to continuously or intermittently vary the wavelength of an emitted light from a start wavelength to a stop wavelength that are desired. A point wavelength information setting section sets the point wavelength information representing the positional information of the driver that corresponds to each resonator length of the external resonator regarding the start wavelength, the stop wavelength and a plurality of the wavelengths obtained by dividing a period between the start wavelength and the stop wavelength into arbitrary steps. An emitted wavelength information detecting section detects emitted wavelength information corresponding to the wavelength of the emitted light from the tunable laser source. A matching determination section determines whether or not the emitted wavelength information detected by the emitted wavelength information detecting section matches each point wavelength information set by the point wavelength information setting section. An information output section outputs predetermined information to the outside, when determination that the emitted wavelength information matches each point wavelength information is obtained from the matching determination section.

18 Claims, 9 Drawing Sheets

| Step number (Angle) | Wavelength |
|---|---|
| 0 (Reference position) | λ (0) |
| 1 | λ (1) |
| 2 | λ (2) |
| 3 | λ (3) |
| 4 | λ (4) |
| ..... | ..... |
| N-1 | λ (N-1) |
| N | λ (N) |

VARIABLE WAVELENGTH LIGHT SOURCE

This application is a U.S. National Phase Application under 35 USC 371 of International Application PCT/JP01/02671 (not published in English) filed Mar. 29, 2001.

TECHNICAL FIELD

The present invention relates to a tunable laser source device, particularly to a tunable laser source device having a tunable laser source of an external resonance type that varies the wavelength of emitted light by changing the resonator length of the external resonator by driving a driver such as a motor, the above tunable laser source device employing a technology capable of sweeping the wavelength of the emitted light at a high speed and capable of outputting the accurate information of the wavelength to be swept.

BACKGROUND ART

Generally in many cases, the measurement of optical characteristics by an optical device is performed by a measurement system, in which the emitted light from the tunable laser source device capable of varying the wavelength is input to a device under test (DUT) and various kinds of the optical characteristics of the DUT are measured based on the change of the output light from the DUT with respect to the wavelength of the input light.

FIG. 9 schematically shows the constitution of the prior art as the optical characteristics measuring system for such an optical device.

That is, in the optical characteristics measuring system for the optical device, for example, the input light whose wavelength is variable to a DUT 100 such as an optical band-path filter is input to a tunable laser source device 201 constituting an optical transmitter 200 via an optical transmission path 101 such as an optical fiber.

The output light from the DUT 100 is output to, for example, an optical characteristics measuring device 301 such as an optical spectrum analyzer constituting an optical receiver 300 via an optical transmission path 102 such as the optical fiber.

Then, in the optical characteristics measuring device 301, as described later, various kinds of the optical characteristics, for example, band-pass characteristics of the optical band-path filter are measured based on the change of the output light from the DUT 100 with respect to the wavelength of the input light by performing data processing in a data processor, after an electric signal which is obtained by photoelectric conversion at a light receiving unit is sampled in a sampling unit.

In this case, wavelength information of the input light necessary for each processing of the optical characteristics measuring device 301 on the side of the optical receiver 300, for example, a tunable start wavelength, an stop wavelength, a tunable range and the like, are transmitted by the so-called CPU communication from a CPU 202 included in a controller on the side of the optical transmitter 200 to a CPU 302 included in the controller on the side of the optical receiver 300.

FIG. 10 is a block diagram exemplifying a concrete constitution of a controller 130 on the side of the optical transmitter 200 used in the foregoing measurement system and a tunable laser source 121 of the external resonance type which can be controlled by the controller 130.

Here, the tunable laser source 121 of the external resonance type is constituted so as to vary the wavelength of an omitted light by changing the resonator length of the resonator constituted of a diffraction grating 1c rotatively driven by a motor 123 as the driver, an optical lens 1b and a laser diode (LD) 1a.

It is to be noted that a stepping motor is used as the motor 123 herein.

Wavelength information input means 131 in the controller 130 is used to input information for determining a point wavelength for measurement including a start wavelength $\lambda s$ and a stop wavelength $\lambda e$ for sweep by, for example, key operation.

Further, point information measurement means 132 in the controller 130 stores and sets, as point information, in a point information memory 133, a step number m of the motor 123 corresponding to each point wavelength including the start wavelength $\lambda s$ and the stop wavelength $\lambda e$ for the sweep, based on the information input from the wavelength information input means 131 and the information stored in a memory table 133.

Furthermore, in the memory table 133 in the controller 130, for example, a state where the emitted wavelength of the tunable laser source 121 is longest is set as a reference, and wavelengths $\lambda(0), \lambda(1) \ldots \lambda(N)$ in the case that the entire tunable wavelength range is indicated by a predetermined unit wavelength (for example, 0.01 nm) and the step numbers $0, 1 \ldots N$ of the motor 123 corresponding to these wavelengths are stored in advance.

Furthermore, in the case where the start wavelength $\lambda s$ and the stop wavelength $\lambda e$ for the sweep and a point number M are input from, for example, the wavelength information input means 131, the point information setting means 133 in the controller 130 obtains a wavelength distance $\Delta \lambda$ by dividing a difference between the start wavelength $\lambda s$ and the stop wavelength $\lambda e$ by a number smaller than the point number M by 1, and then obtains the point wavelengths of M pieces, $\lambda p(1)=\lambda s$, $\lambda p(2)=\lambda s+\Delta \lambda$, $\lambda p(3)=\lambda s+2\Delta \lambda, \ldots \lambda p(M-1)=\lambda e-\Delta \lambda$, $\lambda p(M)=\lambda e$.

Then, this point information setting means 33 selects the step numbers $m(1), m(2) \ldots m(M)$ which correspond to these point wavelengths, respectively, from the memory table 133, and stores and sets in the point information memory 134.

It is to be noted that, in the case that the wave distance $\Delta \lambda$ is designated instead of the stop wavelength $\lambda e$, the point wavelengths of M pieces, $\lambda p(1)=\lambda s$, $\lambda p(2)=\lambda s+\Delta \lambda$, $\lambda p(3)=\lambda s+2\Delta \lambda, \ldots \lambda p(M-1)=\lambda s+(M-2)\Delta \lambda$, $\lambda p(M)=\lambda s+(M-1)\Delta \lambda=\lambda e$ are obtained, and the step numbers $m(1), m(2) \ldots m(M)$ which correspond to these point wavelengths are stored and set in the point information memory 134.

Further, when drive control means 135 in the controller 130 receives a start instruction of measurement from an operation unit or the like not shown, it obtains the step number $m(1)$ corresponding to the start wavelength $\lambda s$ from the point information memory 134.

Then, the drive control means 135 outputs an up-pulse to positively rotate the motor 123, if the obtained $m(1)$ is positive.

Alternatively, the drive control means 135 outputs a down-pulse to reversal rotate the motor 123, if the obtained $m(1)$ is negative.

Then, the drive control means 135 initially sets the emitted wavelength to one step before the start wavelength $\lambda s$, and thereafter, sweeps the wavelength of the emitted light in a range of from the start wavelength $\lambda s$ to the stop wavelength $\lambda e$ by continuously outputting the up-pulse for positively rotating the motor 23 by a number equal to a difference m(M)−m(1) between the step number m(1) corresponding to the start wavelength λs and the step number m(M) corresponding to the stop wavelength λe.

Here, the drive control means 135 gradually shortens a pulse frequency from the initial period of the drive until reaching a predetermined speed, and gradually lengthens the pulse frequency from the predetermined speed until stopping, in order to control the motor 123 in a trapezoid.

Further, a driver 136 in the controller 130 supplies the up-pulse and the down-pulse output from the drive control means 135 to the motor 123, thereby driving the motor 123 in steps.

Furthermore, sweep signal output means 141 in the controller 130 is constituted of voltage data generation means 141a, a voltage data memory 141b, voltage data reading means 141b an a D/A converter 141d.

Here, among the point wavelengths λp(1), λp(1) . . . λp(M) determined by the information input from the wavelength information input means 131, the voltage data generation means 141a generates a predetermined sweep starting voltage Vs (for example, 0V) for the start wavelength λs=pλ(1), a predetermined sweep ending voltage Vet (for example, 10V) for the stop wavelength λe=λp(M), and a voltage data of V(I)=(i−1)×(Vs−Vs)/(M−1) for point wavelengths λp(1) (i=2, 3 . . . M−1) between them in the case that a distance between the point wavelengths is constant, and then, the same means 141a stores and sets the voltage data in the voltage data memory 141b.

It is to be noted that the voltage data generation means 141a obtains the point wavelength from the information input from the wavelength information input means 131, and generates the voltage data utilizing the point wavelength obtained by the foregoing point information setting means 132.

Further, the voltage data reading means 141c sequentially reads out the voltage data V(1), v(2) . . . V(m) from the voltage data memory 141b to set them in the D/A converter 141c.

Accordingly, the voltage monotonically changes from the D/A converter 141d so as to be a value corresponding to the emitted wavelength, that is, a sweep signal is output in which the voltage rises by (Vs−Vs)/(M−1) every time the emitted wavelength matches each point wavelength.

As described above, the tunable laser source device used on the side of the optical transmitter 200 in the optical characteristics measuring system of such an optical device is constituted of the laser source 121 of the external resonance type that varies the emitted wavelength by changing the resonator length of the external resonator which is constituted of a laser diode 1a, a diffraction grating 1c for diffracting the emitted light of this laser diode 1a and an optical lens 1b, and the controller 130 that controls the motor 123 of this laser source 121 to output the light of a desired wavelength from the laser source 121.

The controller 130 on the side of this optical transmitter 200 previously stores a relation between the wavelength of the emitted light and rotation positional information of the diffraction grating 1c which ca be varied by the motor 123, and stops the diffraction grating 1c at the rotation position corresponding to the point wavelength designated to be measured, and then transmits a signal (wavelength information) which shows reaching the point wavelength to the side of the optical transmitter 300 by the CPU communication as described above, whereby the sampling and the like of the data can be performed on the side of the optical transmitter 300.

However, in the measurement system using in this way the tunable laser source device that stops the movement of the diffraction grating 1c every time the designated point wavelength is reached, when there are a number of point wavelengths, for example, as in a case where the band-pass characteristics and the like of the optical band-path filter are measured, activation and stopping of the motor 123 must be repeated every time all the point wavelengths.

Particularly, in the case of the stepping motor generally used as the motor 123, the activation and stopping need to be performed at an extremely low speed in order to rotate accurately by a slight amount of angle.

Thus, when such slow activation and stopping are subjected to the stepping motor at every point wavelength, a time of from an initial point wavelength to the last point wavelength becomes extremely long. Moreover, since the wavelength information at every time needs to be transmitted each time from the side of the optical transmitter 200 to the side of the optical transmitter 300 by the aforesaid CPU communication, there has existed a problem that a time required for the measurement as the entire measurement system became extremely long.

DISCLOSURE OF THE INVENTION

An object of the present invention is to provide a tunable laser source device, particularly a tunable laser source device having a tunable laser source of an external resonance type that varies the wavelength of an emitted light by driving a driver such as a motor to change the resonator length of an external resonator, whereby the wavelength of the emitted light can continuously or intermittently be varied at a high speed in a range of from a previously set start wavelength to stop wavelength so that a high speed measurement can be performed even in the case where it is applied to an optical characteristics measuring system of an optical device having a number of the point wavelengths, and accurate wavelength information of the wavelength varied continuously or intermittently at a high speed can be output.

According to the present invention, to achieve the foregoing object, there is provided:

(1) a tunable laser source device having a tunable laser source (21) in which a wavelength of emitted light is continuously or intermittently varied from a start wavelength to a stop wavelength that are previously set, by varying, with a driver (23), a resonator length of an external resonator which is constituted including a laser diode (24) and a diffraction grating (26), the tunable laser source device comprising:

point wavelength information setting means (32) for setting point wavelength information representing positional information about the driver, which corresponds to each resonator length of the external resonator regarding the start wavelength and the stop wavelength of the light emitted from the tunable laser source and a plurality of wavelengths obtained by dividing a range between the start wavelength and the stop wavelength into arbitrary steps;

drive control means (35) for controlling the driver to continuously or intermittently vary the wavelength of the light emitted from the tunable laser source, in the range of from the start wavelength to the stop wavelength;

emitted wavelength information detecting means (37) for detecting emitted wavelength information corresponding to the wavelength of the light emitted from the tunable laser source, which is continuously or intermittently varied by the drive control means in the range of from the start wavelength to the stop wavelength;

matching determination means (38) for determining whether the emitted wavelength information detected by the emitted wavelength information detecting means matches each point wavelength information set by the point wavelength information setting means; and information output means (40), (41) for receiving an output from the matching determination means and for outputting predetermined information to an outside when the emitted wavelength information matches each point wavelength information.

In addition, according to the present invention, to achieve the foregoing object, there is provided:

(2) the tunable laser source device described in (1), in which the information output means comprises timing information output means (40) for receiving an output of the matching determination means and for outputting, as the predetermined information, to the outside, timing information representing a time when the emitted wavelength information matched each point information.

Further, according to the present invention, to achieve the foregoing object, there is provided:

(3) the tunable laser source device described in (1), in which the information output means comprises sweep signal output means (41) for receiving an output of the matching determination means and for outputting, as the predetermined information, to the outside, a sweep signal that monotonically varies to change a voltage at a time the emitted wavelength information matched the point information, to a value corresponding to the wavelength of the emitted light.

Further, according to the present invention, to achieve the foregoing object, there is provided:

(4) the tunable laser source device described in (1), in which the information output means comprises:

timing information output means (40) for receiving an output of the matching determination means and for outputting, as the predetermined information, to the outside, timing information representing a time when the emitted wavelength information matched each point information; and sweep signal output means (41) for receiving an output of the matching determination means and for outputting, as the predetermined information, to the outside, a sweep signal that monotonically varies to change a voltage at a time the emitted wavelength information matched the point information, to a value corresponding to the wavelength of the emitted light.

Furthermore, according to the present invention, to achieve the foregoing object, there is provided:

(5) the tunable laser source device described in (1), in which the emitted wavelength information detecting means comprises a counter (37) for counting an output of the drive control means.

Still further, according to the present invention, to achieve the foregoing object, there is provided:

(6) the tunable laser source device described in (1), in which the emitted wavelength information detecting means comprises a counter (37) for counting an output corresponding to the positional information about the driver.

Still further, according to the present invention, to achieve the foregoing object, there is provided:

(7) the tunable laser source device described in (1), in which the emitted wavelength information detecting means detects the emitted wavelength information based on an output corresponding to the positional information about the driver.

Furthermore, according to the present invention, to achieve the foregoing object, there is provided:

(8) the tunable laser source device described in (1), in which the emitted wavelength information detecting means detects the emitted wavelength information based on an output corresponding to the wavelength of the light emitted from the tunable laser source.

BEST MODE FOR CARRYING OUT OF THE INVENTION

Figure 1:
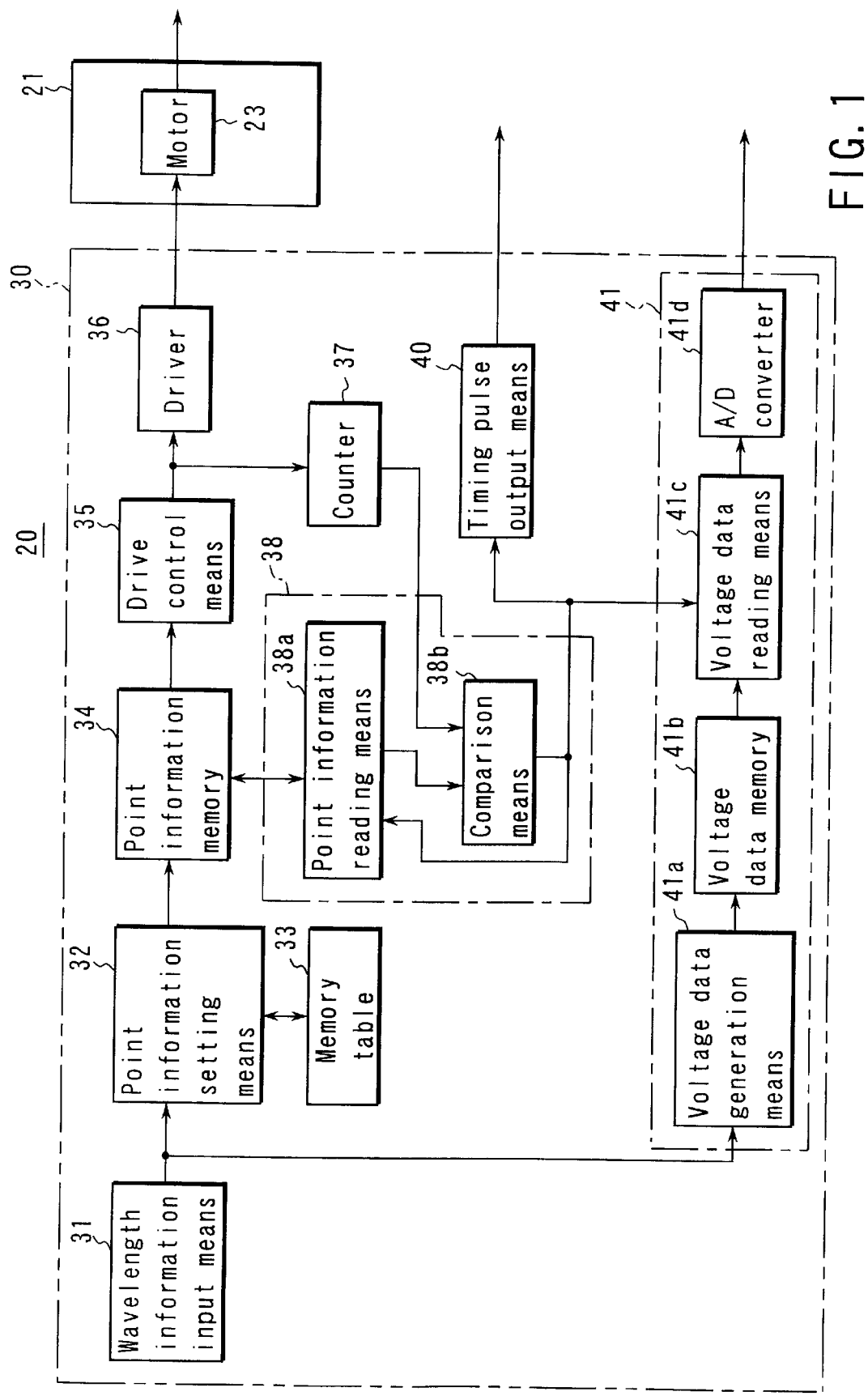
FIG. 1 is a block diagram showing the constitution of a first embodiment of the tunable laser source device according to the present invention.

Firstly, the outline of the present invention will be described. The first tunable laser source device of the present invention is a tunable laser source device having an external resonance type tunable laser source (21) in which the wavelength of an emitted light is varied by changing the resonator length of an external resonator, which is constituted including a laser diode (24) and a diffraction grating (26), by means of a driver (23), the tunable laser source device comprising a point wavelength information setting means (32) for setting point information corresponding to a desired point wavelength including a start wavelength and a stop wavelength for sweep which continuously or intermittently varies at a high speed from the previously set start wavelength to stop wavelength; drive control means (35) for controlling the driver so that the wavelength of the emitted light of the tunable laser source may sweep in a range of from the start wavelength to the stop wavelength; emitted wavelength information detecting means (37) for detecting the emitted wavelength information corresponding to the wavelength of the emitted light which is varied by the drive control means; the matching determination means (38) for determining whether or not the emitted wavelength information detected by the emitted wavelength detecting means matches each point wavelength information set by the point wavelength information setting means; and the information output means (40) for outputting, to the outside, timing information representing a time when the emitted wavelength information has matched each point wavelength information after receiving the output of the matching determination means.

Furthermore, the second tunable laser source device of the present invention is a tunable laser source device having a tunable laser source (21) in which the wavelength of an emitted light is varied by changing the resonator length of an external resonator, which is constituted including a laser diode (24) and a diffraction grating (26), by means of a driver (23), the tunable laser source device comprising point wavelength information setting means (32) for setting point information corresponding to a desired point wavelength including a start wavelength and a stop wavelength for sweep which continuously or intermittently varies at a high speed from the previously set start wavelength to stop wavelength; a drive control means (35) for controlling the driver so that the wavelength of the emitted light of the tunable laser source may sweep in a range of from the start wavelength to the stop wavelength; emitted wavelength information detecting means (37) for detecting emitted wavelength information corresponding to the wavelength of the emitted light which is varied by the drive control means; matching determination means (38) for determining whether or not the emitted wavelength information detected by the emitted wavelength detecting means matches each point wavelength information set by the point wavelength information setting means; and information output means (41) for outputting, to the outside, sweep signal that monotonically varies so that a voltage at a time when the emitted wavelength information has matched the point information may become a value corresponding to the wavelength of the emitted light after receiving the output of the matching determination means.

Further, the first optical device measurement system of the present invention comprises a tunable laser source device (20) having an external resonance type tunable laser source (21) in which the wavelength of an emitted light is varied by changing, with a driver (23), the resonator length of an external resonator which is constituted including a laser diode (24) and a diffraction grating (26), the tunable laser source device (20) inputting the emitted light of the tunable laser source to an optical device (1); a receiving unit (50) for receiving the light output from the optical device to be measured which has received the emitted light of the tunable laser source device, to output a signal representing a characteristic value of the received light; and sampling means (51) for sampling an output signal of the receiving unit, whereby the characteristics of the optical device to be measured are evaluated based on a sampling value of the sampling means, and the tunable laser source device comprises point information setting means (32) for setting point information corresponding to a desired point wavelength including a start wavelength and a stop wavelength for sweep which continuously or intermittently varies at a high speed from the previously set start wavelength to stop wavelength; drive control means (35) for controlling the driver so that the wavelength of the emitted light of the tunable laser source may sweep in a range of from the start wavelength to the stop wavelength; emitted wavelength information detecting means (37) for detecting the emitted wavelength information corresponding to the wavelength of the emitted light which is varied by the drive control means; matching determination means (38) for determining whether or not emitted wavelength information detected by the emitted wavelength detecting means matches each point information set by the point information setting means; and timing information output means (40) for outputting, to the outside, timing information representing a time when the emitted wavelength information has matched each point wavelength information after receiving the output of the matching determination means, whereby the sampling means performs the sampling of a signal from the receiving unit based on the sampling information from the timing information output means.

Furthermore, the second optical device measurement system of the present invention comprises a tunable laser source device (20) having an external resonance type tunable laser source (21) in which the wavelength of an emitted light is varied by changing, with a driver (23), the resonance length of an external resonator which is constituted including a laser diode (24) and a diffraction grating (26), the tunable laser source device (20) inputting the emitted light of the tunable laser source to an optical device (1) to be measured; a receiving unit (50) for receiving the light output from the optical device to be measured which has received the emitted light of the tunable laser source device, to output a signal representing a characteristic value of the received light; and display means (53) for sweeping a time axis to display a output signal level of the receiving unit on the time axis, whereby the characteristics of the optical device to be measured are evaluated based on the display of the display means, and the tunable laser source device comprises point information setting means (32) for setting point information corresponding to a desired point wavelength including a start wavelength and a stop wavelength for sweep which continuously or intermittently varies at a high speed from the previously set start wavelength to stop wavelength; drive control means (35) for controlling the driver so that the wavelength of the emitted light of the tunable laser source may sweep in a range of from the start wavelength to the stop wavelength; emitted wavelength information detecting means (37) for detecting the emitted wavelength information corresponding to the wavelength of the emitted light which is varied by the drive control means; matching determination means (38) for determining whether or not emitted wavelength information detected by the emitted wavelength detecting means matches each point information set by the point information setting means; and sweep signal output means (41) for outputting, to the outside, a sweep signal that monotonically varies so that a voltage at a time when the emitted wavelength information has matched the point information may become a value corresponding to the wavelength of the emitted light after receiving the output of the matching determination means, whereby the display means sweeps the time axis by the sweep signal output from the sweep signal output means.

Next, some embodiments of the present invention based on the foregoing outline will be described with reference to the drawings.

(First Embodiment)

FIG. 1 shows the constitution of a tunable laser source device 20 according to the first embodiment of the present invention.

This tunable laser source device 20 is constituted of a tunable laser source 21 of the external resonance type, which is constituted so that a resonator length may be varied by the rotative drive of a motor 23 as a driver and the wavelength of an emitted light may continuously or intermittently be varied from a start wavelength to a stop wavelength that are previously set, as described later, and a controller 30 that controls this tunable laser source 21.

Figures 2, 3:
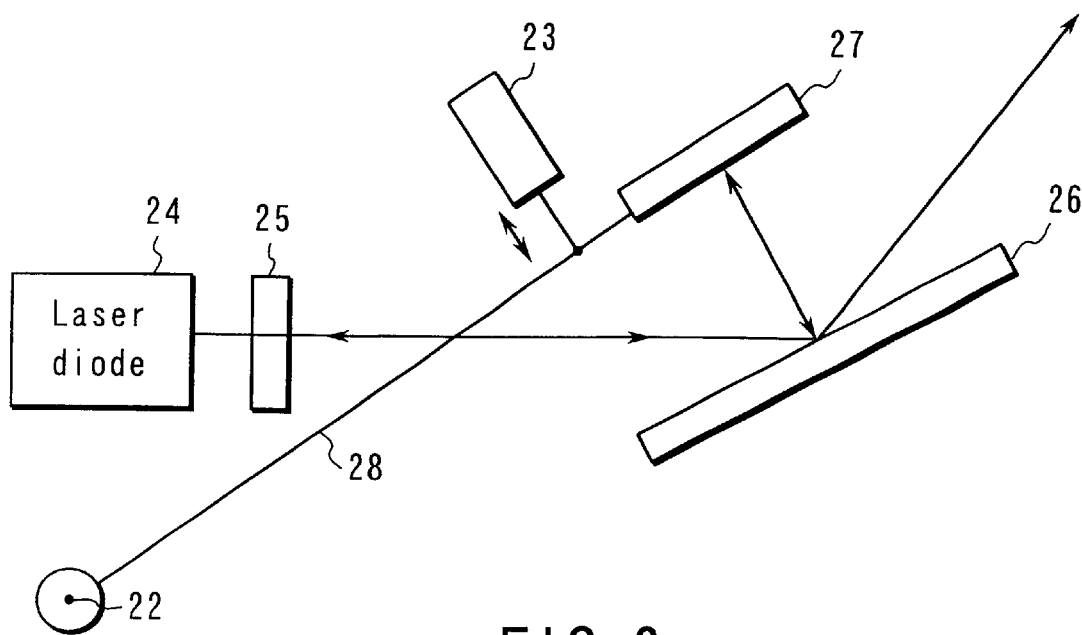
FIG. 2 is a view showing a constitutional example of a principal portion of the tunable laser source device of FIG. 1.
FIG. 3 is a view showing to explain the stored content of a memory table in the tunable laser source device of FIG. 1.

Herein, the tunable laser source 21 is constituted, for example, as shown in FIG. 2.

That is, the light output from the laser diode 24 is output to a diffraction grating 26 after converted into a parallel light by a collimator 25.

The light diffracted from this diffraction grating 26 to a reflecting mirror 27 is returned to the laser diode 24 from the diffraction grating 26 via the laser diode 24 after being reflected by the reflecting mirror 27.

In such a constitution, the reflecting mirror 27 is supported at the other end side of an arm 28 whose one end side is supported by a rotation fulcrum 22.

This arm 28 is pushed or pulled by the rotative operation of the motor 23, whereby the reflecting mirror 27 is allowed to approach or go away from the diffraction grating 26.

Accordingly, the wavelength of the emitted light is varied by changing an optical path length (an external resonator length) from the laser diode 24 to the reflecting mirror 27 via the diffraction grating 26.

It is to be noted that a stepping motor is used as the motor 23 herein.

Although not shown, the tunable laser source of the external resonance type may be used in which the diffraction grating is rotated by the driver without using the reflecting mirror 27, to vary the wavelength of the emitted light.

In such a tunable laser source 21 of the external resonance type, the wavelength of the emitted light corresponds to a rotation angle of the arm 28 (or a rotation angle of the diffraction grating).

In addition, the rotation angle of the arm 28 corresponds to the rotation angle of the motor 23.

Then, when the motor 23 is the stepping motor as described above, a pulse number (a step number) given to the motor 23 corresponds to the change of the wavelength of the emitted light, because the shaft of the motor 23 is rotated by a predetermined angle step by a pulse given to the motor 23.

Accordingly, in the tunable laser source device 20 according to this first embodiment, the pulse number (the step number) given to the motor 23 is controlled as one of the information corresponding to the wavelength.

On the other hand, wavelength information input means 31 of the controller 30 is used to input information for determining the point wave for measurement that includes the start wavelength λs and the stop wavelength λe for the sweep which continuously or intermittently changes the wavelength of the emitted light from the tunable laser source 21 in a range of from the previously set start wavelength to stop wavelength by, for example, key operation.

Further, information setting means 32 of the controller 30 stores and sets, as the point information, in a point information memory 33, the step number m of the motor 23 corresponding to each point wavelength including the start wavelength λs and the stop wavelength λe based on the information input from the wavelength information input means 31 and the information stored in the memory table 33.

In this memory table 33, as shown in FIG. 3, if a state where the arm 28 of the tunable laser source 21 is in a predetermined position (for example, a position where the wavelength of the emitted light becomes longest) is set as a reference, there are previously stored wavelengths λ(0), λ(1) . . . λ(N) in the case that the entire tunable wavelength range is shown by a predetermined unit wavelength (for example, 0.01 nm) and the step numbers 0, 1 . . . N of the motor 23 corresponding to these wavelengths.

Furthermore, the point information setting means 33 of the controller, in the case where the start wavelength λs and the stop wavelength λe and the point number M are input from the wavelength information input means 31, for example, obtains the point wavelengths of M pieces λp(1)=λs, λp(2)=λs+Δλ, λp(3)=λs+2Δλ, . . . λp(M−1)=λe−Δλ, λp(M)=λe, after obtaining the wavelength distance Δλ by dividing a difference between the start wavelength λs and the stop wavelength λe by a number smaller than the point number M by 1.

Then the point information setting means 33 selects the step number m(1), m(2) . . . m(M) that severally correspond to the point wavelengths from the memory table 33, and stores and sets in a point information memory 34.

It is to be noted that, in the case where the wave distance Δλ is designated instead of the stop wavelength λe, the point wavelengths of M pieces λp(1)=λs, λp(2)=λs+Δλ, λp(3)=λs+2Δλ, . . . λp(M−1)=λs+(M−2)Δλ, λp(M)=λs+(M−1)Δλ=λe are obtained, and the step number m(1), m(2) . . . m(M) that severally correspond to the point wavelengths are stored and set in the point information memory 34.

Further, when drive control means 35 of the controller 30 receives the start instruction of measurement from the operation unit or the like (not shown), it obtains a difference Δm [=m(1)−m'] between the step number m(1) corresponding to the start wavelength λs and a count output m' of a counter 37 (described later) from the point information memory 34.

Then, the drive control means 35 outputs (|Δm|−1) pieces of the up-pulse to positively rotate the motor 23 when the obtained difference Δm is positive.

Alternatively, the drive control means 35 outputs (|Δm|+1) pieces of the down-pulse to reversely rotate the motor 23 when the obtained difference Δm is negative.

And then, the drive control means 35 initially sets the wavelength of the emitted light to one step before the start wavelength λs, and changes the wavelength of the emitted light in a range of from the start wavelength λs to the stop wavelength λe by continuously or intermittently outputting the up-pulse for positively rotating the motor 23 thereafter by a number equal to a difference m(M)−m(1) between the step number m(1) corresponding to the start wavelength λs and the step number m(M) corresponding to the stop wavelength λe.

Herein, the drive control means 35 makes the pulse frequency from the initial period of the drive until reaching the predetermined speed gradually shorter and makes the pulse frequency from the predetermined speed until stopping gradually longer in order to control the motor 23 in a trapezoid.

Further, a driver 36 of the controller 30 supplies the up-pulse and the down-pulse output from the drive control means 35 to the motor 23 to drive the motor 23 in steps.

Furthermore, the counter 37 of the controller 30 comprises the emitted wavelength detecting means for detecting the emitted wavelength information corresponding to the wavelength of the emitted light in the first embodiment.

That is, this emitted wavelength information detecting means is constituted of the counter of an up-down type designed to perform up-counting to the up-pulse output from the drive control means 35 and down-counting to the down-pulse output from the drive control means.

Then, the counting output of the counter 37 is output to the outside as the emitted wavelength information corresponding to the wavelength of a current emitted light.

It is to be noted that the counter 37 is backed-up by a battery or the like so as to hold the counting content to prevent a correspondence relation between the emitted wavelength and the counting output from shifting at the time of turning on the power even if power supply is stopped.

Still further, matching determination means 38 of the controller 30 determines whether or not the counting output m' of the counter 37 matches the step number m(1), m(2) . . . m(M) stored in the point information memory 34, and outputs the matching signal every time they are matched.

The matching determination means 38 is constituted of point information reading means 38a and comparison means 38b.

The point information reading means 38a repeatedly performs an operation so that the step number m(1) stored in the point information memory 34 may be read out when starting measurement to be set to the comparison means 38b and the next step number m(2) is set again to the comparison means 38b when the matching signal is output from the comparison means 38b.

In addition, the comparison means 38b of the controller 30 compares the counting output m' of the counter 37 and the step number form the point information reading means 38a to output the matching signal every time the both match.

Further, timing pulse output means 40 of the controller 30 is the one constituting the timing information output means of the first embodiment, and outputs the timing pulse of a predetermined pulse width, in which a level transits from one (a low level, for example) of two values to the other (a high level, for example), to the outside as the timing information representing a matching time at a timing when the matching signal is output from the matching determination means 38.

The timing pulse indicates a time when the wavelength of the emitted light has matched the point wavelength at its rising period.

Furthermore, sweep signal output means 41 of the controller 30 outputs to the outside the sweep signal that changes monotonically so that a voltage at a time when the wavelength information of the emitted light has matched the point information may become the value corresponding to the wavelength of the emitted light, after receiving the output from the matching determination means 38.

The sweep signal output means 41 is constituted of voltage data generation means 41a, a voltage data memory 41b, voltage data reading means 41b and a D/A converter 41d.

Herein, the voltage data generation means 41a generates the voltage data of V(I)=(I−1)×(Vs−Vs)/(M−1) to store and set in the voltage data memory 41b in the case of the predetermined sweep starting voltage Vs (0V, for example) for the start wavelength $\lambda s=\lambda p(1)$, of the predetermined sweep ending voltage Vet (10V, for example) for the stop wavelength $\lambda e=\lambda p(M)$, and where a distance between the point wavelengths is constant to each point wavelength $\lambda p(I)$ (i=2, 3 . . . M−1) between them, among the point wavelengths $\lambda p(1)$, $\lambda p(1)$ . . . $\lambda p(M)$ determined by the information input from the wavelength information input means 31.

It is to be noted that the voltage data generation means 41a obtains the point wavelength from the information input from the wavelength information input means 31 as well as generates the voltage data utilizing the point wavelength obtained by the foregoing point information setting means 32.

Further, the voltage data reading means 41c sequentially reads out the voltage data V(1), v(2) . . . V(m) to set them in the D/A converter 41c.

Accordingly, the voltage changing monotonically from the D/A converter 41d so as to be a value corresponding to the emitted wavelength, that is, the sweep signal is output in which the voltage rises by (Vs−Vs)/(M−1) in steps every time the wavelength of the emitted light matches each point wavelength.

It is to be noted that when the time axis of display means 53 is swept to perform wavelength observation by using the sweep signal that changes in steps in this manner, as described later, a time resolving power (a wavelength resolving power) of the display is determined in a point wavelength distance.

Thus, the point wavelength distance needs to be small when it is required that the wavelength observation is strictly performed.

In addition, description is made herein for the case where the sweep starting voltage Vs and the sweep ending voltage Vet are determined in advance, and the sweep starting voltage Vs and the sweep ending voltage Vet are the ones for determining the display position and the length of the time axis of the display means 53 (described later).

That is, since the position and the length of the time axis of the display means such as an oscilloscope can be generally adjusted arbitrarily on the side of the display means, the constitution may be made so that the voltage severally corresponding to each point wavelength may be output between arbitrary the sweep starting voltage Vs and the sweep ending voltage Vet without setting the sweep starting voltage Vs and the sweep ending voltage Vet to fixed values as described above.

Figure 4:
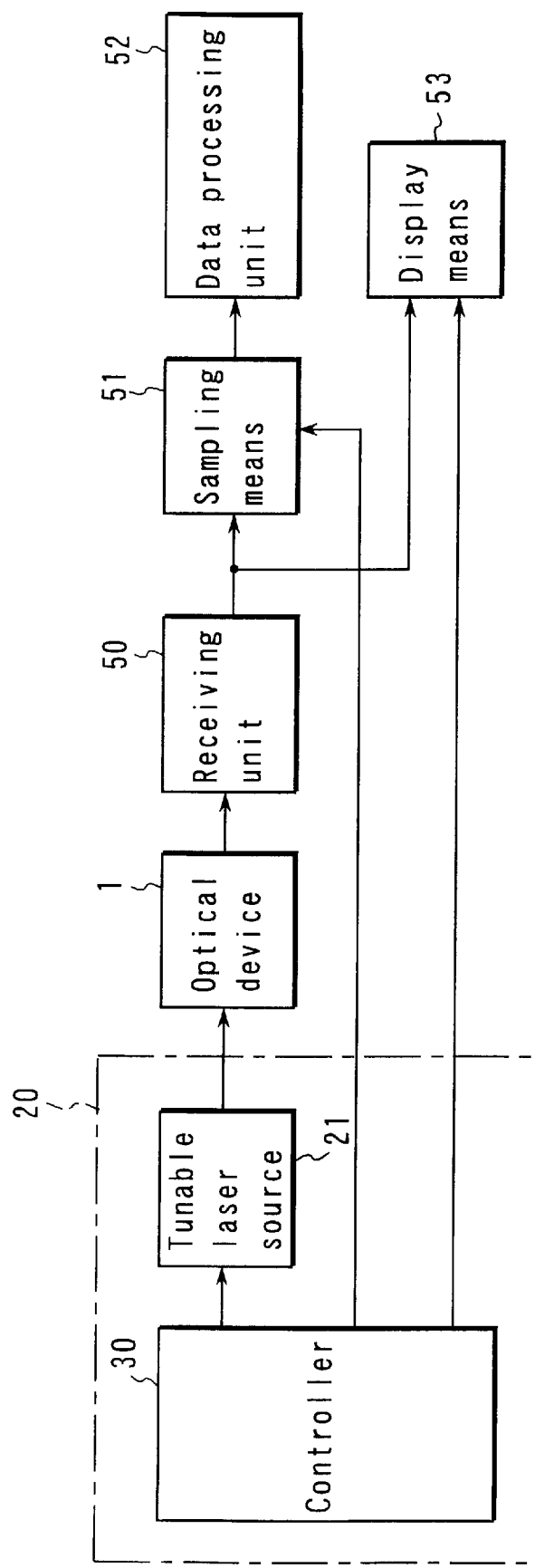
FIG. 4 is a block diagram showing the constitution of the entire optical characteristics measuring system to which the tunable laser source device of FIG. 1 is applied.

FIG. 4 shows the constitution of the optical characteristics measuring system of the optical device to which the tunable laser source device 20 according to the first embodiment of the present invention is applied.

In the optical characteristics measuring system of the optical device, the emitted light from the tunable laser source 21 is input to the optical device (DUT) 1 to be measured.

And then, the light output from the optical device 1 is converted into an electrical signal to be output by being received by a receiving unit 50.

That is, the receiving unit 50 outputs it to sampling means 51 and display means 53 as a receiving signal whose voltage changes in accordance with the intensity of an incident light.

Herein, the sampling means 51 converts the receiving signal, to which sampling was performed, into a digital value and outputs it to data processing section 52 by performing sampling to the receiving signal from the receiving unit 50 synchronizing with the rising of the timing pulse from the controller 30.

The data processing section 52 obtains the anti-wavelength characteristics of the optical device (DUT) to be measured by performing predetermined data processing to the digital value output from the sampling means 51 synchronizing with the timing pulse.

Further, the display means 53 is set in an XY mode in advance, and, by receiving the sweep signal from the controller 30 by an X-axis (a time axis), sweeps the X-axis by the sweep signal to display the level of the receiving signal from the receiving unit 50 input to a Y-axis on the X-axis.

Next, description will be made for the operation of the tunable laser source device 20 and the optical characteristics measuring system of the optical device.

As described, when the start wavelength λs, the stop wavelength λe (or the wavelength distance Δλ) and the point number M are input from the wavelength information input means 31, the step number m(1), m(2) . . . m(M) corresponding to the point wavelengths λp(1), λp(1) . . . λp(M) is stored and set to the point information memory 34 as the point information.

In addition, the voltage data V(1), V(2) . . . V(M) corresponding to the point wavelengths λp(1), λp(1) λp(M) is stored and set to he voltage data memory 41b by the voltage data generation means 41a of the sweep signal output means 41.

Herein, the drive control means 35 confirms the current counting output m' of the counter, and initially sets the wavelength λ of the emitted light immediately before the start wavelength λ by rotating the motor 23 so that the step number may become the value m(1)−1 smaller than the step number m(1) corresponding to the start wavelength λs by 1.

Figure 5A:
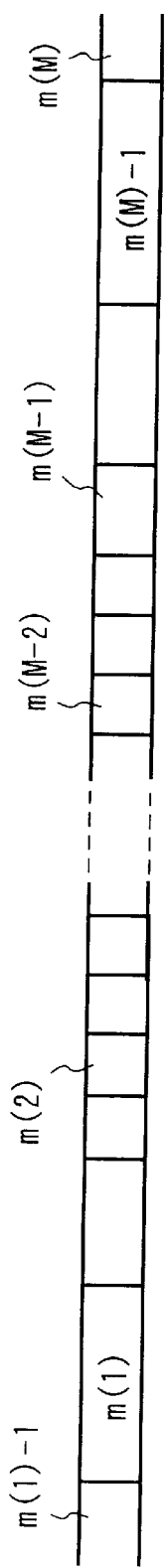
FIGS. 5A to 5D are timing charts explaining the operation of the tunable laser source device of FIG. 1.

The start of measurement is instructed by the initial setting operation in the state where the counting output m' of the counter 37 is set to m(1)−1 as shown in FIG. 5A.

Figure 5B:
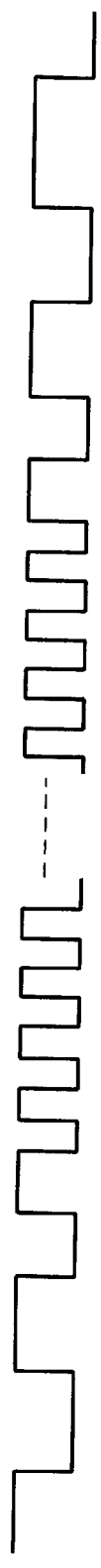

Accordingly, as shown in FIG. 5B, the up-pulse whose period changes in a trapezoid state is continuously output from the drive control means 35.

The motor 23, after rotating as its speed is gradually increased to a predetermined speed by the up-pulse that changes in the trapezoid state, rotates at a constant speed once it reaches the predetermined speed.

The motor 23, after gradually reducing its speed as the wavelength of the emitted light is close to the stop wavelength λe by the up-pulse that changes in the trapezoid state, stops when the wavelength of the emitted light becomes equal to the stop wavelength λe.

In addition, the counting value m' of the counter 37 increases from M(1)−1 to m(1), m(2) . . . m(M) as shown in FIG. 5A with the rotation of the motor 23.

Figure 5C:
Figure 5D:
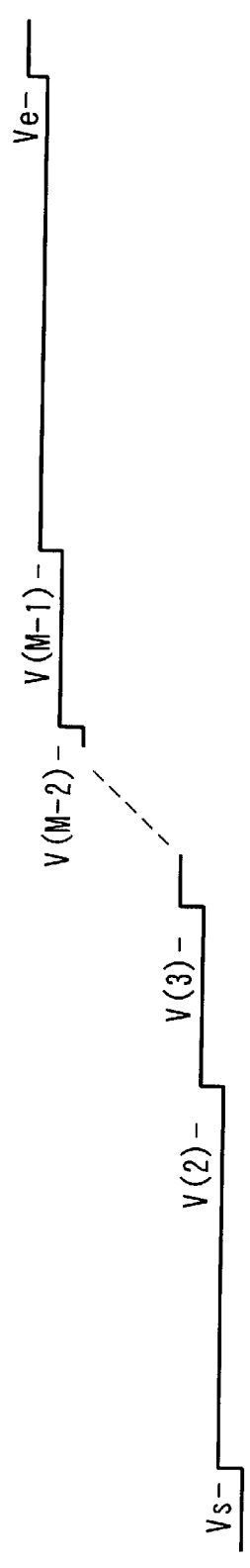

Therefore, when the first up-pulse is output and the counting value m' matches the value m(1) corresponding to the start wavelength λs, a first timing pulse rising from the low level to the high level is output from the timing pulse output means 40 as shown in FIG. 5C.

Thereafter, every time the counting output m' matches the step number m(2), m(3) . . . m(M) of each point information, that is, every time the wavelength of the emitted light matches each point wavelength, the timing pulse rising from the low level to the high level is output from the timing pulse output means 40.

The sampling means 51 performs sampling to the receiving signal from the receiving unit 50 at the rising time of the timing pulse to transform it into the digital value.

Thus, in the wavelength of the emitted light, sampling is accurately performed to the receiving signal at every designated point wavelength to be transformed into the digital value regardless of the speed change of the sweep that continuously or intermittently changes at a high speed in a range of from the start wavelength λs to the stop wavelength λe that are set in advance.

Further, with the increase of the counting output m' of the counter 37, the voltage changes in steps every time the counting output m' matches the step number m(1), m(2) . . . m(M), that is, every time the wavelength of the emitted light matches each point wavelength, the sweep signal that increases monotonically is output from the sweep output means 41 so as to be the value corresponding to the wavelength of the emitted light.

Thus, the sweep signal of the voltage accurately corresponding to the wavelength of the receiving signal input to the Y-axis is input to the X-axis of the display means 53 regardless of the speed change of the sweep that continuously or intermittently varies at a high speed in a range of from the start wavelength λs to the stop wavelength λe that are set in advance.

As described, sampling of the receiving signal can be accurately performed in timing that matches each point wavelength of the emitted light.

The anti-wavelength characteristics of the optical device 1 can be accurately analyzed in the data processing section 52.

Furthermore, since the voltage of the sweep signal also accurately changes correspondingly to the wavelength of the emitted light, the characteristics displayed on the display means 53 have a very high accuracy of its wavelength axis and the characteristics of the optical device 1 can be accurately grasped on a display screen.

It is to be noted that when the sweep signal whose voltage changes in steps is used as in the first embodiment, the resolving power of the time axis (the wavelength axis) of the display means 53 is determined by the distance of the point wavelength, strict wavelength observation can be performed by setting the distance of the point wavelength.

It is to be noted that, in the first embodiment, the counting output (the emitted wavelength information) of the counter 37 as the emitted wavelength information detecting means is compared with the step number (the point number) by the comparison means 38b of the matching determination means 38.

However, a down counter (an up-counter may be used) capable of presetting data can serve as the emitted wavelength information detecting means and the comparison means of the matching determination means.

In this case, the point information reading means 38a may sequentially preset the difference of the step number corresponding to each point wavelength to the counter every time a borrow signal (a signal specifying the value 0) is received as the matching signal.

(Second Embodiment)

In the foregoing first embodiment, the emitted wavelength information detecting means detects the information corresponding to the emitted wavelength by counting the drive pulse output from the drive control means 35.

Figure 6:
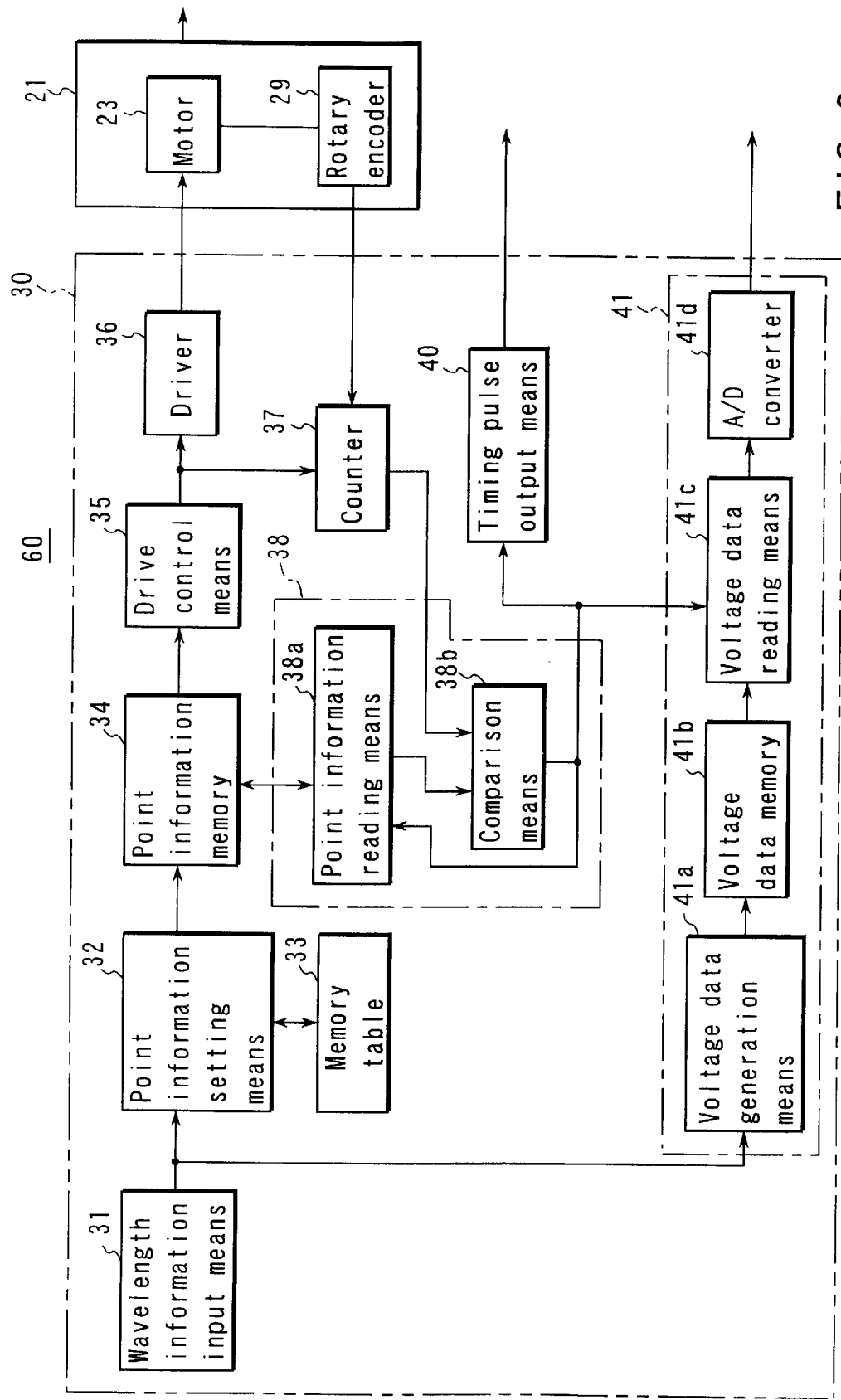
FIG. 6 is a block diagram showing the case where the emitted wavelength information detecting means in the tunable laser source device is changed as a second embodiment of the tunable laser source device according to the present invention.

However, in the second embodiment, a rotary encoder 29, which outputs a signal representing a rotation direction of the motor 23 (or the arm 28) and outputs one pulse every time the motor 23 (or the arm 28) rotates for a predetermined angle, and the counter 37 of an up-down type, which counts the pulse of the rotary encoder 29, constitute the emitted wavelength information detecting means such as a tunable laser source device 60 shown in FIG. 6.

(Third Embodiment)

Figure 7:
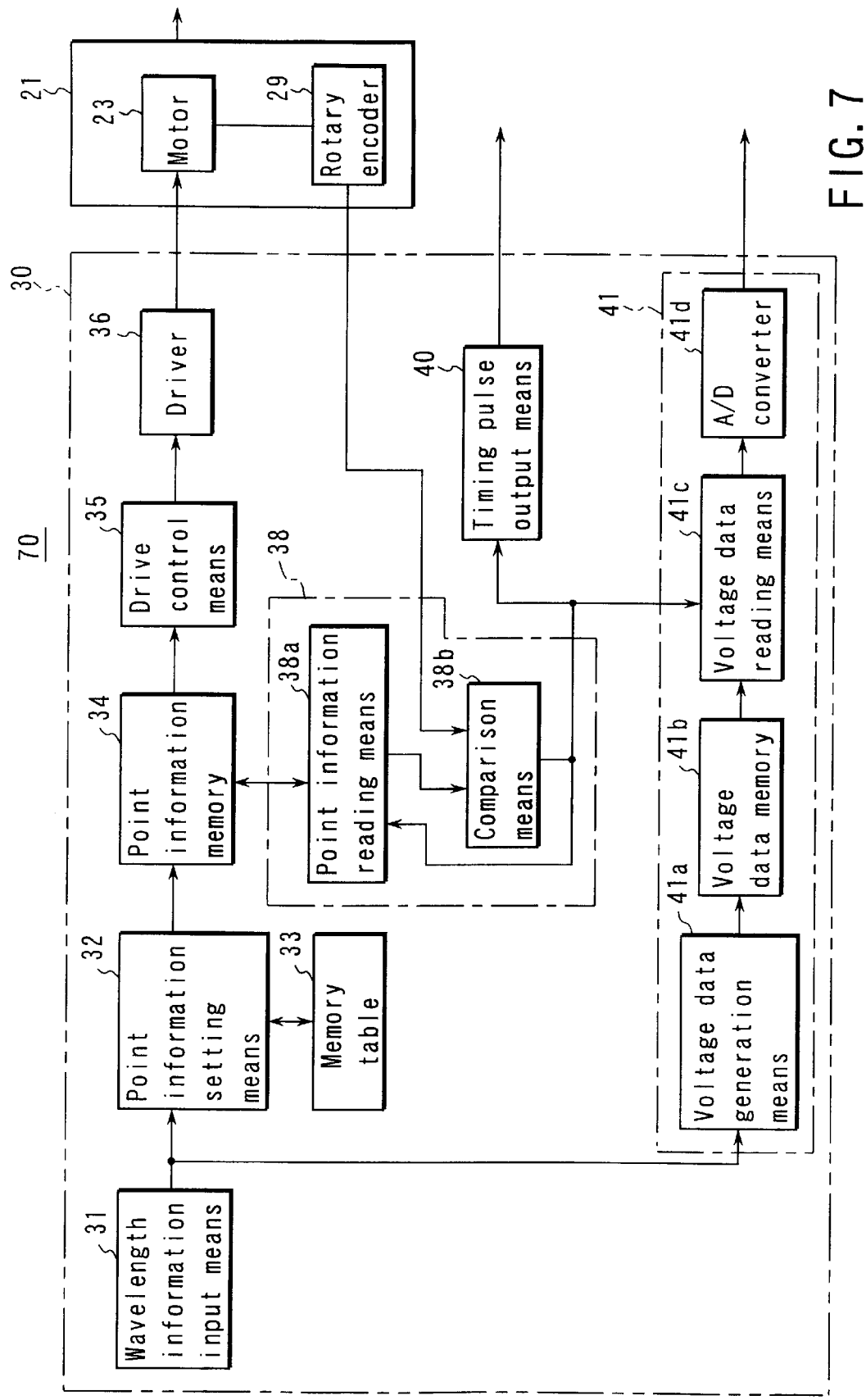
FIG. 7 is a block diagram showing the case where the emitted wavelength information detecting means in the tunable laser source device is changed as a third embodiment of the tunable laser source device according to the present invention.
Figure 8:
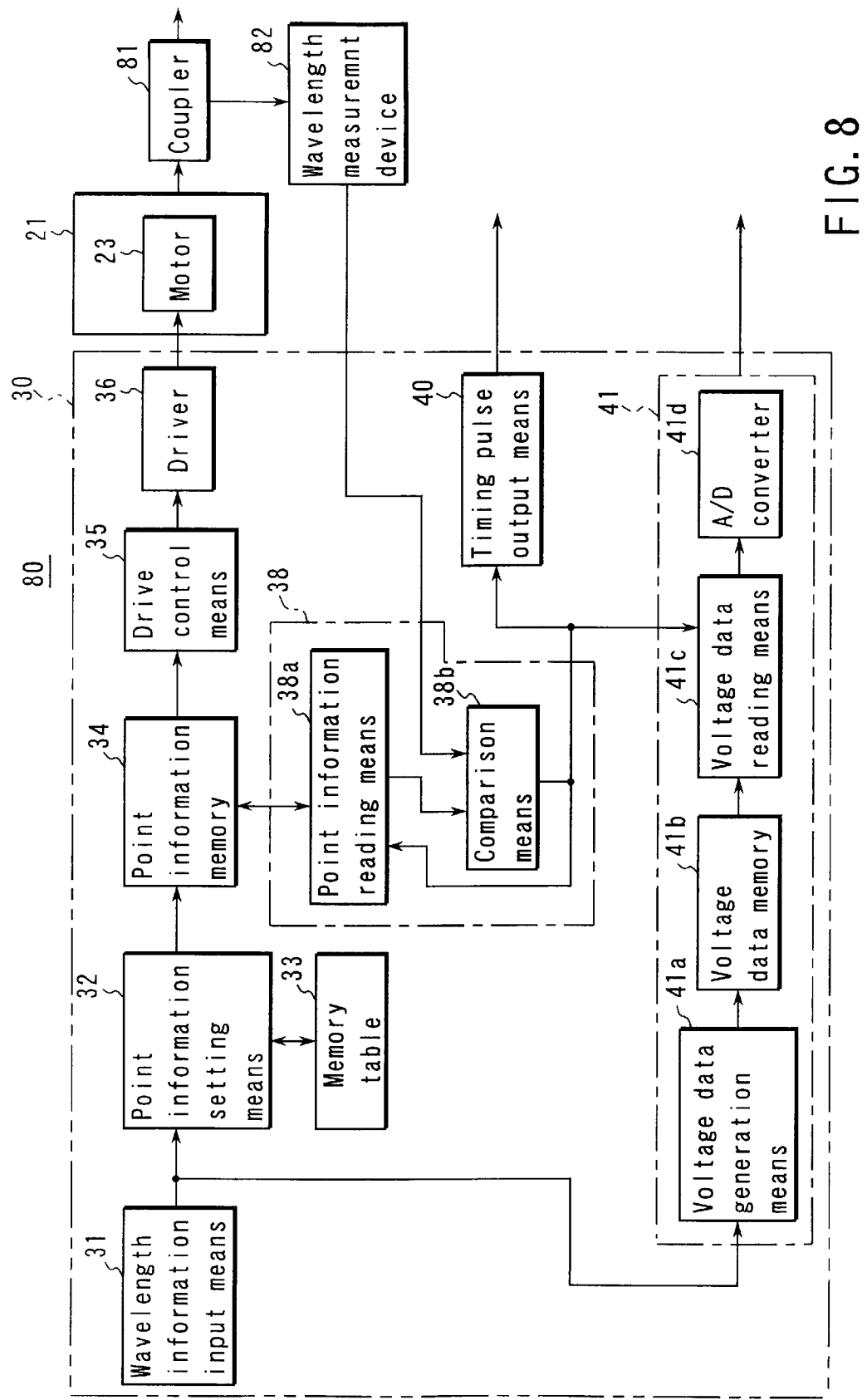
FIG. 8 is a block diagram showing the case where the emitted wavelength information detecting means in the tunable laser source device is changed as a fourth embodiment of the tunable laser source device according to the present invention.
Figure 9:
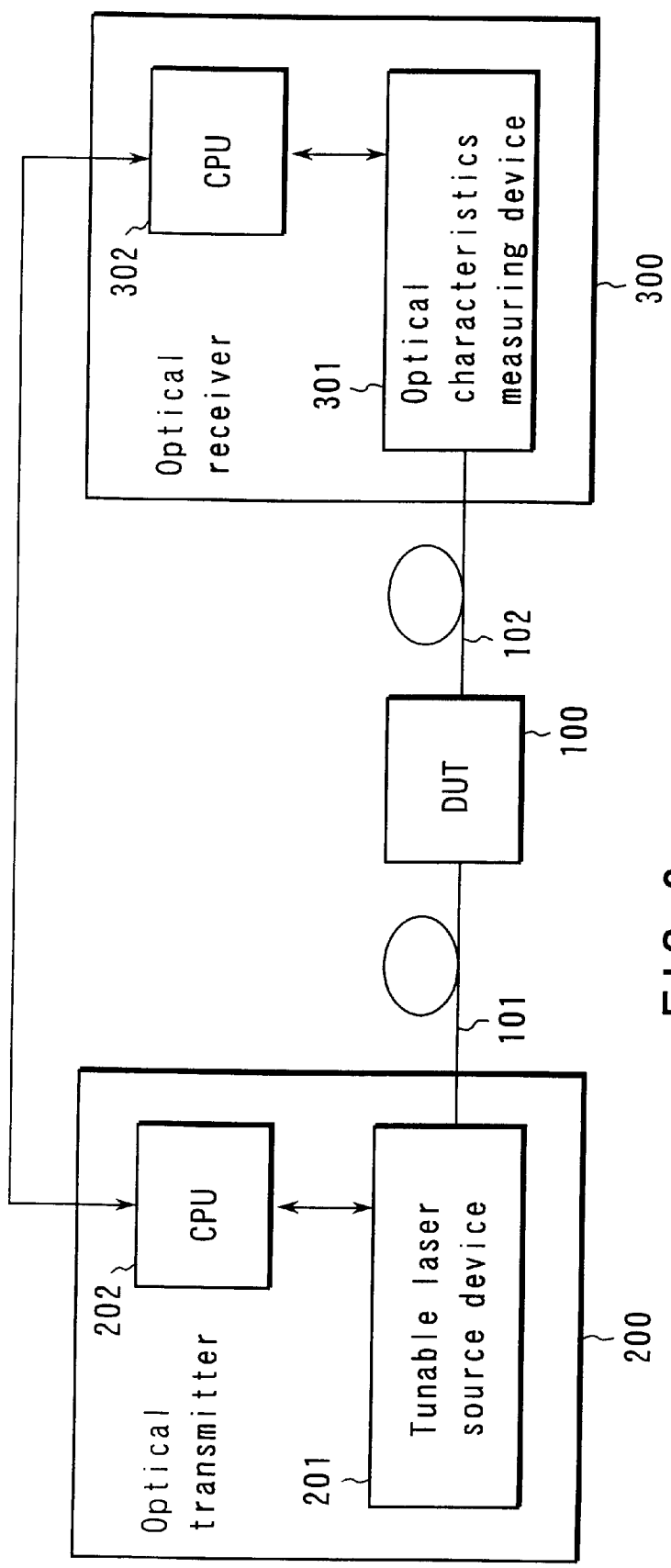
FIG. 9 is a block diagram schematically showing the constitution of the entire optical characteristics measuring system to which a conventional tunable laser source device is applied.
Figure 10:
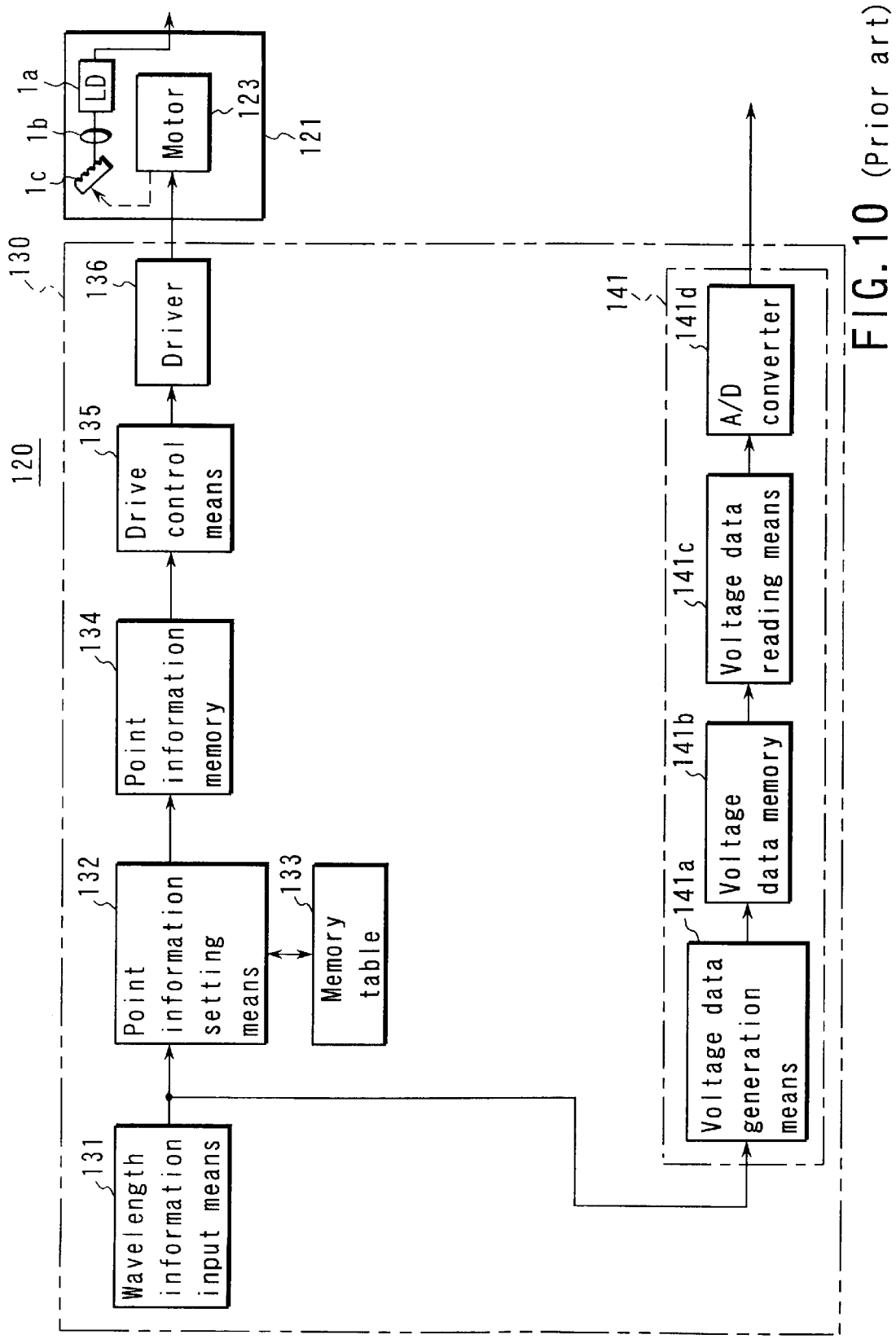
FIG. 10 is a block diagram exemplifying the concrete constitution of the controller on the optical transmitter side used in a conventional optical characteristics measuring system and the tunable laser source of the external resonance type controlled by the controller.

Furthermore, as the third embodiment, a rotary encoder 29', which outputs data representing the angle position itself of the motor 23 (or the arm 28) without using the counter, may be used as the emitted wavelength information detecting means such as a tunable laser source device 70 shown in FIG. 7.

It is to be noted that when the rotary encoders 29 and 29' are used as described above, a motor of a serial drive type can be used as the motor 23 other than the foregoing stepping motor.

In addition, in the first embodiment, the angle information (the step number) is controlled as the point information and the emitted wavelength information by utilizing that the wavelength of the emitted light corresponds to the angle of an optical device of the tunable laser source 21.

However, this does not limit the present invention, and any kind of information may be used as long as the kind of the information detected and output by the wavelength information detecting means and the kind of the point information set by the point information setting means of the emitted light are matched.

(Fourth Embodiment)

For example, as the fourth embodiment, control can be performed by using the wavelength information itself such as a tunable laser source device 80.

In the tunable laser source device 80 according to the fourth embodiment, a part of the light output from the tunable laser source 21 is split by a coupler 81 and input to a wavelength measurement device 82 as the emitted wavelength information detecting means, and the wavelength of the emitted light itself is detected.

Simultaneously with the this, the point information setting means 32 stores and sets the point wavelengths $\lambda p(1), \lambda p(1) \ldots \lambda p(M)$ including the start wavelength $\lambda s$ and the stop wavelength $\lambda e$ based on the input information.

Further, the point information reading means 38a of the matching determination means 38 sequentially reads out the point wavelength in the point information memory 34 to set in the comparison means 38b.

Then, the comparison means 38b compares the wavelength of the emitted light output from the wavelength measurement device 82 and the point wavelength read out by the point information reading means 38a, and outputs the matching signal every time the both are matched.

Furthermore, although not shown, in the case where the emitted wavelength information detecting means, which outputs an analog signal whose voltage changes correspondingly to the emitted wavelength, is used, the point information setting means 32 may set the voltage data corresponding to the point wavelengths $\lambda p(1), \lambda p(1) \ldots \lambda p(M)$ severally to the point information memory 34 as the point information.

Furthermore, in the first embodiment, the timing pulse, whose level transits every time the wavelength of the emitted light matches a desired point wavelength, is output as the timing information.

This does not limit the present invention, and, for example, the data (the counting value) of a time when the emitted wavelength has matched the desired point wavelength may be output to the outside by using a timer that starts time count (counting of a clock signal) from a reference time (sweep starting time or the like).

As described, the tunable laser source device of the present invention comprises: the point wavelength information setting means for setting the point information corresponding to a desired point wavelength including the start wavelength and the stop wavelength of the sweep; the drive control means for controlling the driver so that the wavelength of the emitted light of the tunable laser source may sweep in a range of from the start wavelength to the stop wavelength; emitted wavelength information detecting means for detecting the emitted wavelength information corresponding to the wavelength changed by the drive control means; the matching determination means for determining whether or not the emitted wavelength information detected by the emitted wavelength detecting means matches each point wavelength information set by the point wavelength information setting means; and the timing information output means for outputting to the outside the timing information representing the time when the emitted wavelength information has matched each of the point wavelength information after receiving the output of the matching determination means.

Accordingly, the timing when the wavelength of the light output from the tunable laser source reached the desired point wavelength can be accurately informed to the outside, the emitted wavelength can be continuously swept in a range of from the start wavelength to the stop wavelength, and thus efficient measurement by a high speed sweep is enabled.

Moreover, in the case of comprising the sweep signal output means for outputting the sweep signal, such as the tunable laser source device of the present invention, which changes monotonically so that a voltage at a time when the emitted wavelength information has matched the point information may become the value corresponding to the wavelength of the emitted light after receiving the output of the matching determination means, the timing when the wavelength of the light output from the tunable laser source reached the desired point wavelength can be accurately informed to the outside, the emitted wavelength can be continuously swept in a range of from the start wavelength to the stop wavelength even if there is a number of the stop wavelengths, and thus efficient measurement by a high speed sweep is enabled.

Furthermore, in the optical characteristics measuring system of the optical device to which the tunable laser source device of the present invention is applied, sampling to the receiving signal from the receiving unit is performed based on the timing information from the tunable laser source device, sampling of the receiving signal of each desired point can be accurately performed, and thus the characteristics of the optical device to the wavelength can be accurately grasped.

Still further, in the optical characteristics measuring system of the optical device to which the tunable laser source device of the present invention is applied, since the sweep of the time axis of the display means is performed by the sweep signal from the tunable laser source device, the level of the receiving signal of each desired point can be accurately performed, and thus the characteristics of the optical device to the wavelength can be accurately grasped.

Therefore, as described in detail above, according to the present invention, particularly in the tunable laser source device having the tunable laser source of the external resonance type, which changes the length of the external resonator by driving the driver such as the motor, the tunable laser source device can be provided in which the wavelength of the emitted light can be continuously or intermittently varied at a high speed in a range of from the start wavelength to the stop wavelength that are set in advance and the accurate wavelength information of the wavelength changed at a high speed continuously or intermittently can be output in order to make a high speed measurement can be performed even in the case where it is applied to the optical characteristics measuring system of the optical device having a number of the point wavelengths.

What is claimed is:

1. A tunable laser source device having a tunable laser source in which a wavelength of emitted light is continuously or intermittently varied from a start wavelength to a stop wavelength that are previously set, by varying, with a driver including a stepping motor, a resonator length of an external resonator which includes a laser diode and a diffraction grating, said tunable laser source device comprising:

point wavelength information setting means for setting point wavelength information representing positional information about the driver, which corresponds to each resonator length of the external resonator regarding the start wavelength and the stop wavelength of the light emitted from the tunable laser source and a plurality of wavelengths obtained by dividing a range from the start wavelength to the stop wavelength into arbitrary steps;

drive control means for controlling driving pulses to be supplied to the stepping motor of the driver continuously or intermittently to vary the wavelength of the light emitted from the tunable laser source, in the range from the start wavelength to the stop wavelength;

emitted wavelength information detecting means for detecting emitted wavelength information corresponding to the wavelength of the light emitted from the tunable laser source, which is continuously or intermittently varied by the drive control means in the range from the start wavelength to the stop wavelength;

matching determination means for determining whether the emitted wavelength information detected by the emitted wavelength information detecting means matches the point wavelength information set by the point wavelength information setting means; and information output means for receiving an output from the matching determination means and for outputting predetermined information when the emitted wavelength information matches the point wavelength information;

wherein the emitted wavelength information detecting means includes a counter for counting the driving pulses which are supplied from the driving control means to the stepping motor of the driver as an output of the drive control means, to thereby detect the emitted wavelength information.

2. The tunable laser source device according to claim 1, wherein said information output means comprises timing information output means for receiving the output of the matching determination means and for outputting, as the predetermined information, timing information representing when the emitted wavelength information matches the point wavelength information.

3. The tunable laser source device according to claim 1, wherein said information output means comprises sweep signal output means for receiving the output of the matching determination means and for outputting, as the predetermined information, a sweep signal that monotonically varies to change a voltage when the emitted wavelength information matches the point wavelength information, to a value corresponding to the wavelength of the emitted light.

4. A tunable laser source device having a tunable laser source in which a wavelength of emitted light is continuously or intermittently varied from a start wavelength to a stop wavelength that are previously set, by varying, with a driver, a resonator length of an external resonator which includes a laser diode and a diffraction grating, said tunable laser source device comprising:

point wavelength information setting means for setting point wavelength information representing positional information about the driver, which corresponds to each resonator length of the external resonator regarding the start wavelength and the stop wavelength of the light emitted from the tunable laser source and a plurality of wavelengths obtained by dividing a range from the start wavelength to the stop wavelength into arbitrary steps;

drive control means for controlling the driver continuously or intermittently to vary the wavelength of the light emitted from the tunable laser source, in the range from the start wavelength to the stop wavelength;

emitted wavelength information detecting means for detecting emitted wavelength information corresponding to the wavelength of the light emitted from the tunable laser source, which is continuously or intermittently varied by the drive control means in the range of from the start wavelength to the stop wavelength;

matching determination means for determining whether the emitted wavelength information detected by the emitted wavelength information detecting means matches the point wavelength information set by the point wavelength information setting means; and timing information output means for receiving an output from the matching determination means, and for outputting timing information representing when the emitted wavelength information matches said point wavelength information.

5. The tunable laser source device according to claim 4, wherein the emitted wavelength information detecting means includes a counter for counting output information from the drive control means.

6. The tunable laser source device according to claim 4, wherein the emitted wavelength information detecting means includes a counter for counting output information corresponding to the positional information about the driver.

7. The tunable laser source device according to claim 4, wherein the emitted wavelength information detecting means detects the emitted wavelength information based on output information corresponding to the positional information about the driver.

8. The tunable laser source device according to claim 4, wherein the emitted wavelength information detecting means detects the emitted wavelength information based on output information corresponding to the wavelength of the light emitted from the tunable laser source.

9. A tunable laser source device having a tunable laser source in which a wavelength of emitted light is continuously or intermittently varied from a start wavelength to a stop wavelength that are previously set, by varying, with a driver, a resonator length of an external resonator which includes a laser diode and a diffraction grating, said tunable laser source device comprising:

point wavelength information setting means for setting point wavelength information representing positional information about the driver, which corresponds to each resonator length of the external resonator regarding the start wavelength and the stop wavelength of the light emitted from the tunable laser source and a plurality of wavelengths obtained by dividing a range from the start wavelength to the stop wavelength into arbitrary steps;

drive control means for controlling the driver continuously or intermittently to vary the wavelength of the light emitted from the tunable laser source, in the range from the start wavelength to the stop wavelength;

emitted wavelength information detecting means for detecting emitted wavelength information corresponding to the wavelength of the light emitted from the tunable laser source, which is continuously or intermittently varied by the drive control means in the range of from the start wavelength to the stop wavelength;

matching determination means for determining whether the emitted wavelength information detected by the emitted wavelength information detecting means matches the point wavelength information set by the point wavelength information setting means; and sweep signal output means for receiving an output from the matching determination means and for outputting a sweep signal that monotonically varies to change a voltage when the emitted wavelength information matches the point wavelength information, to a value corresponding to the wavelength of the emitted light.

10. The tunable laser source device according to claim 9, wherein the emitted wavelength information detecting means includes a counter for counting output information from the drive control means.

11. The tunable laser source device according to claim 9, wherein the emitted wavelength information detecting means includes a counter for counting output information corresponding to the positional information about the driver.

12. The tunable laser source device according to claim 9, wherein the emitted wavelength information detecting means detects the emitted wavelength information based on output information corresponding to the positional information about the driver.

13. The tunable laser source device according to claim 9, wherein the emitted wavelength information detecting means detects the emitted wavelength information based on output information corresponding to the wavelength of the light emitted from the tunable laser source.

14. A tunable laser source device having a tunable laser source in which a wavelength of emitted light is continuously or intermittently varied from a start wavelength to a stop wavelength that are previously set, by varying, with a driver, a resonator length of an external resonator which includes a laser diode and a diffraction grating, said tunable laser source device comprising:

point wavelength information setting means for setting point wavelength information representing positional information about the driver, which corresponds to each resonator length of the external resonator regarding the start wavelength and the stop wavelength of the light emitted from the tunable laser source and a plurality of wavelengths obtained by dividing a range from the start wavelength to the stop wavelength into arbitrary steps;

drive control means for controlling the driver continuously or intermittently to vary the wavelength of the light emitted from the tunable laser source, in the range from the start wavelength to the stop wavelength;

emitted wavelength information detecting means for detecting emitted wavelength information corresponding to the wavelength of the light emitted from the tunable laser source, which is continuously or intermittently varied by the drive control means in the range of from the start wavelength to the stop wavelength;

matching determination means for determining whether the emitted wavelength information detected by the emitted wavelength information detecting means matches the point wavelength information set by the point wavelength information setting means; and information output means for receiving an output from the matching determination means and for outputting predetermined information when the emitted wavelength information matches the point wavelength information;

wherein said information output means comprises:

timing information output means for receiving the output from the matching determination means and for outputting timing information representing when the emitted wavelength information matches the point wavelength information; and sweep signal output means for receiving the output of the matching determination means and for outputting a sweep signal that monotonically varies to change a voltage when the emitted wavelength information matches the point wavelength information, to a value corresponding to the wavelength of the emitted light.

15. The tunable laser source device according to claim 14, wherein the emitted wavelength information detecting means includes a counter for counting output information from the drive control means.

16. The tunable laser source device according to claim 14, wherein the emitted wavelength information detecting means includes a counter for counting output information corresponding to the positional information about the driver.

17. The tunable laser source device according to claim 14, wherein the emitted wavelength information detecting means detects the emitted wavelength information based on output information corresponding to the positional information about the driver.

18. The tunable laser source device according to claim 14, wherein the emitted wavelength information detecting means detects the emitted wavelength information based on output information corresponding to the wavelength of the light emitted from the tunable laser source.

* * * * *